United States Patent [19]

Hokuyo et al.

[11] 4,177,477
[45] Dec. 4, 1979

[54] SEMICONDUCTOR SWITCHING DEVICE

[75] Inventors: Shigeru Hokuyo; Hiroshi Gamo, both of Itami, Japan

[73] Assignee: Mitsubishi Denki Kabushiki Kaisha, Japan

[21] Appl. No.: 793,242

[22] Filed: May 3, 1977

Related U.S. Application Data

[63] Continuation of Ser. No. 557,156, Mar. 10, 1975, abandoned.

[30] Foreign Application Priority Data

Mar. 11, 1974 [JP] Japan .................................. 49 28739

[51] Int. Cl.² ..................... H01L 29/74; H01L 29/167
[52] U.S. Cl. ........................................ 357/38; 357/64; 357/91; 357/29
[58] Field of Search ....................... 357/29, 38, 63, 64, 357/91

[56] References Cited

U.S. PATENT DOCUMENTS

| | | | |
|---|---|---|---|
| 3,184,347 | 5/1965 | Hoerni | 357/64 |
| 3,268,782 | 8/1966 | Weinstein | 357/64 |
| 3,320,103 | 5/1967 | Drake et al. | 357/64 |
| 3,440,113 | 4/1969 | Wolley | 357/38 |
| 3,442,722 | 5/1969 | Bauerlein et al. | 357/64 |
| 3,444,444 | 5/1969 | Yamashita et al. | 357/64 |
| 3,487,276 | 12/1969 | Wolley | 357/64 |
| 3,539,401 | 11/1970 | Yamashita | 357/64 |
| 3,840,887 | 10/1974 | Roberts et al. | 357/91 |
| 3,852,612 | 12/1974 | Roberts et al. | 29/584 |
| 3,860,947 | 1/1975 | Gamo et al. | 357/64 |
| 3,872,493 | 3/1975 | Roberts et al. | 357/29 |
| 3,990,091 | 11/1976 | Cresswell et al. | 357/64 |

*Primary Examiner*—William D. Larkins
*Assistant Examiner*—Gene M. Munson
*Attorney, Agent, or Firm*—Robert E. Burns; Emmanuel J. Lobato; Bruce L. Adams

[57] ABSTRACT

The stabilization of electrical switching parameters in a semiconductor switching device is achieved by selectively doping a portion of semiconductor material with a heavy metal and irradiating the remaining semiconductor material. In an important embodiment of the invention, a center-fired four region semiconductor switching device consisting of silicon semiconductor material is prepared by gold doping the silicon in the area around the center firing gate contact where initial conduction of current is concentrated. The remainder of the active area of the device is irradiated to provide recombination centers for fast switching without the adverse effect on blocking leakage current that is attributable to indiscriminate gold doping. The gold provides recombination centers in the initial conductive area which are not subject to annealing as are the recombination centers provided by irradiation.

7 Claims, 1 Drawing Figure

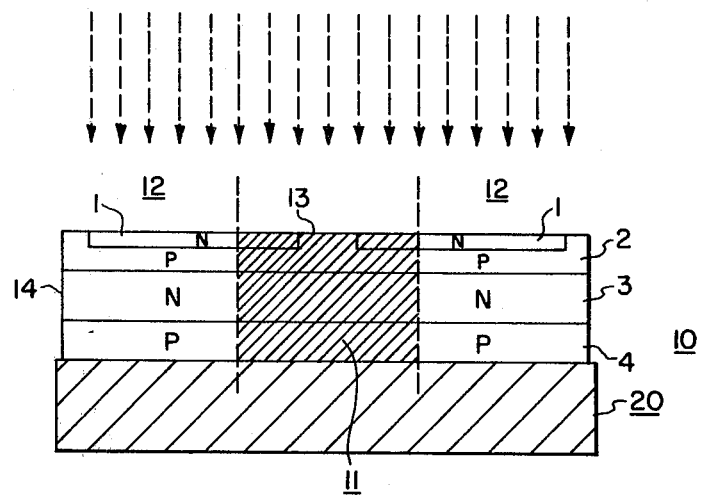

SEMICONDUCTOR SWITCHING DEVICE

This is a continuation, of application Ser. No. 557,156, filed Mar. 10, 1975, now abandoned.

BACKGROUND OF THE INVENTION

1. Field of the Invention

The present invention relates to the manufacture of semiconductor devices and particularly to four region semiconductor switches such as thyristors.

2. Description of the Prior Art

It is known that the switching speed of semiconductor switching devices, such as thyristors, generally depends upon carrier lifetime.

Methods of shortening the lifetime of carriers in semiconductors which have been employed in the prior art include doping with a heavy metal or irradiating with radioactive radiation.

Copper, iron and gold are examples of heavy metals known to reduce carrier lifetime in semiconductors. For example, see U.S. Pat. No. 3,556,879. Gold, however, is the preferred dopant for use with silicon semiconductor devices.

More specifically, to shorten switching turn-off time, recombination centers are formed in the PNPN silicon element by diffusing gold into the silicon in its entirety or by irradiating the silicon with radioactive radiation of sufficient energy to cause recombination centers to occur in the silicon crystal lattice.

Although irradiation is preferred to gold-doping in the respect that irradiation does not produce the collateral effects on characteristics such as blocking leakage current, the irradiation method suffers from the disadvantage that temperatures in the range of 200° C. to 300° C. occurring during operation of the device will eventually anneal the silicon to the extent that the irradiation produced recombination centers gradually vanish. Temperatures of such magnitude (200° C. to 300° C.) are produced in the initial conduction portion of the device in the vicinity of the gate due to a concentration of current which occurs during the switch's turn-on mode.

Accordingly, the carrier lifetime in irradiated switches increases in duration with the continued operation of the device. That is, as the number of switchings increases, the turn-on time of successive switchings increases. On the other hand, the gold-doping method of producing recombination centers in a switching device also, as noted above, increases the leakage current at high operating temperatures as a result of the effects of doping on the impurity level in the vicinity of the PN junction which blocks applied voltage. This increase in leakage current is proportional to the gold impurity level or concentration in the vicinity of the blocking junction.

Methods of selective irradiation of semiconductor devices are known in the prior art, examples of such methods being set forth in U.S. Pat. Nos. 3,840,887 and 3,852,612. Methods of selective gold doping of semiconductor devices are also known in the art, an example of which is U.S. Pat. No. 3,440,113. The present invention combines the advantages of selective gold doping with the advantages of irradiation to produce a semiconductor switching device with superior electrical characteristics. In a present preferred embodiment of the invention a four region switching device or thyristor device is disclosed which exhibits stability with respect to the fast switching characteristics without compromising other characteristics.

SUMMARY OF THE INVENTION

A semiconductor switching device is constructed in a manner that optimizes electrical switching characteristics by selectively doping only the initial conductive high current carrying portion of the device with a heavy metal to shorten the lifetime of carriers in that portion. This method provides recombination centers in the initial conductive portion that do not degrade in time as do recombination centers provided by irradiation. The remaining active portion of the device is irradiated to increase switching speed thus avoiding the adverse effects on leakage current attributable to indiscriminate gold doping.

Other details and advantages of the invention will become apparent as the following description of the present preferred embodiment and the present preferred method of practicing the invention are discussed.

BRIEF DESCRIPTION OF THE DRAWING

The sole FIGURE is a vertical cross-sectional view of a center-fired four region switching device or thyristor setting forth the teachings of the present invention.

DESCRIPTION OF THE PREFERRED EMBODIMENT

With reference to the FIGURE, a semiconductor wafer 10 preferably of silicon has a PNPN solid state switching element formed by diffusion in a known manner. The switching element comprises an n-type emitter layer 1, a p-type base layer 2, an n-type base layer 3 and a p-type emitter layer 4. The layers are disposed in contiguous PN junction forming relationships.

The p-type base layer 2 has a portion 13 projecting into the middle of the n-type emitter layer 1 to provide a p-type centered gate portion 13. A heavy metal such as copper, iron or gold is doped into a portion of the wafer 10 including the gate 13 and the vicinity around the gate 13 to form a doped portion 11. It is preferred that gold be used as the heavy metal dopant and that the concentration of gold impurities lie in the range from $1 \times 10^{14}$ to $5 \times 10^{16}$ atoms/cm$^3$. Masking and doping techniques are known, for example, see U.S. Pat. No. 3,440,113. The surrounding portion 12 of the wafer which is not subject to gold doping is however irradiated with radio-active radiation. The invention may be practiced by either selectively irradiating just the portion 12 of the wafer 10 as set forth in U.S. Pat. No. 3,840,887, or in the alternative by the indiscriminate irradiation of the entire wafer 10 as illustrated in the drawing by the broken line and arrow marks. It is preferred that the radiation level of electron radiation be greater than 1 Mev. Preferred radiation dosages lie in the range from $1 \times 10^{13}$ electrons/cm$^2$ to $2 \times 10^{14}$ electrons/cm$^2$.

Thus two types of recombination centers are produced in the silicon wafer 10. Gold impurities provide recombination centers in the initial conduction portion 11 in the vicinity of the gate 13, while irradiation produces recombination centers in the remaining portion 12 of the wafer 10.

The edge 14 of the wafer 10 may be protected from the environment in a known manner by means of an insulating and passivating coating not shown. A high temperature curing silicone varnish is a suitable coating material. Attached to the major surface of the wafer 10 adjacent to layer 4 is a reinforcing plate 20 preferably made of molybdenum which serves as an anode contact. At the opposed major surface of the wafer 10 a cathode contact not shown is attached to layer 1 and a gate contact not shown is attached to layer 2 at its central projection 13.

In the above described thyristor construction, during the turn-on mode a high current concentration exists in the vicinity 11 around the gate portion 13 resulting in relatively higher temperatures in portion 11 as compared to portion 12. Temperatures on the order of 200° to 300° C. or higher may exist in portion 11 during normal operation of the thyristor device. Such temperatures are capable of annealing lattice imperfections formed by irradiation. In other words, irradiation produced recombination centers will gradually vanish as a result of such heat. The present invention overcomes this instability problem by selectively doping the portion 11 with gold which provides recombination centers which are insensitive to such temperature. The present invention combines the advantages of gold doping and the advantages of irradiation in a manner that overcomes the disadvantages of each technique when used independently. Selective gold doping in portion 11 provides a stable turn-off time where a merely irradiated device would exhibit progressively increasing turn-off time in use. The irradiation produced recombination centers which are introduced into portion 12 provide fast switching characteristics comparable to devices of the prior art which are indiscriminately gold doped. However, the device of the present invention does not exhibit the high blocking leakage currents which significantly limit the operation of fast switching devices produced by indiscriminate gold doping. Also, as disclosed in U.S. Pat. No. 3,852,612, irradiation techniques can produce thyristors with increased blocking voltage capability without significantly increasing the forward voltage drop of the device, thus providing fast switching thyristors with increased power ratings. The present invention teaches a further improvement in the art by combining the techniques of selective gold doping and selective irradiation.

The advantages of fast switching with increased power rating disclosed by the present invention are not limited to the presently preferred embodiment of a reverse blocking thyristor but also are applicable to the so-called reverse conducting thyristors, AC control thyristors and various other semiconductor switching devices.

What is claimed is:

1. A semiconductor switching device comprising: a wafer of semiconductor material having two major opposed generally parallel surfaces, said wafer comprising four layers of opposite conductivity type disposed in PN junction forming relationships, an n-type emitter layer disposed adjacent to an upper one of the major surfaces, a p-type base layer disposed below the n-type emitter layer and having a region extending upwards through the n-type emitter layer to emerge at the upper major surface and share a portion of the upper major surface with the n-type emitter layer, an n-type base layer below the p-type base layer, a p-type emitter layer below the n-type base layer and extending downwards to the lower major surface, wherein a gate region of the device is defined at the upper major surface at a portion of the surface where the p-type base layer emerges, a metal doped region sufficiently doped with heavy metal atoms to define within said metal doped region stable charge recombination centers, wherein said metal doped region extends throughout an initial conduction region of the device which exhibits an operating temperature in use sufficiently elevated to anneal the semiconductor material comprising said wafer and which consists of the gate region and a portion of the n-type emitter layer immediately adjacent the gate region and the portions of said wafer laying thereunder and extending down to the lower major surface of said wafer, the remainder of said wafer being free of said heavy metal atoms, at least the portion of said wafer free of heavy metal atoms having radiation induced charge recombination centers throughout, and the concentration of radiation induced charge recombination centers in said initial conduction region being substantially less than outside of said initial conduction region.

2. A semiconductor switching device as set forth in claim 1 wherein the heavy metal is gold and the semiconductor material comprises silicon.

3. A semiconductor switching device as set forth in claim 2 wherein the gold impurity concentration is in the range from about $1 \times 10^{14}$ to about $5 \times 10^{16}$ atoms/cm$^3$.

4. A semiconductor switching device as set forth in claim 1 wherein said heavy metal consists of a metal selected from the group consisting of copper, iron and gold.

5. A semiconductor switching device as set forth in claim 1 wherein the radiation induced recombination centers are formed by irradiating said wafer with an electron beam having an intensity greater than 1 Mev. and a dosage in the range from about $1 \times 10^{13}$ electron/cm$^2$ to about $2 \times 10^{14}$ electrons/cm$^2$.

6. A semiconductor switching device comprising a wafer of semiconductor material having a pair of opposed major surfaces and including at least one region having a PNPN layered structure with the outermost layers thereof respectively terminating at the respective major surfaces of said wafer, and wherein a portion of one of the intermediate layers extends through the outermost layer adjacent thereto and emerges at the respective surface of said wafer at which said one of the intermediate layers terminates to define a gate region of the PNPN layered structure, a first main electrode disposed in ohmic contact with the major surface of said wafer at which said gate region terminates and spaced from said gate region, a second main electrode disposed in ohmic contact with the other major surface of said wafer, a gate electrode disposed in ohmic contact with said gate region, heavy metal impurity atoms doped in an initial conduction region of said layered region adjacent said gate electrode for forming stable charge recombination centers effective to control charge carrier lifetime within said initial conduction region, said initial conduction region consisting of said gate region and a portion of said outermost layer adjacent thereto and the portions of said PNPN layered region lying thereunder and extending to the opposite major surface of said wafer, and radiation induced charge recombination centers throughout at least the remainder of said PNPN layered region which is free of heavy metal atoms for controlling the lifetime of charge carriers therein, wherein the concentration of radiation induced charge recombination centers within said initial conduction region is substantially less than outside of said initial conduction region.

7. A semiconductor switching device made according to the process comprising the steps of:

providing a semiconductor wafer having a pair of opposed major surfaces and including at least one region having a PNPN layered structure with the outermost layers thereof respectively terminating at the respective major surfaces of said wafer, and wherein a portion of one of the intermediate layers extends through the outermost layer adjacent thereto and emerges at the respective surface of said wafer at which said one of the intermediate layers terminates to define a gate region of the PNPN layered structure;

doping an initial conduction region which consists of the gate region of the PNPN layered structure and a region of the outermost layer immediately adjacent the gate region and the portions of said PNPN layered structure lying thereunder to the opposite major surface of said wafer with heavy metal atoms to form charge recombination centers; and irradiating at least the portion of the PNPN layered structure of said semiconductor wafer free of heavy metal atoms to form radiation induced charge recombination centers therein with the concentration of radiation induced charge recombination centers in said initial conduction region being substantially less than outside of said initial conduction region.

* * * * *